(12) United States Patent
Potter et al.

(10) Patent No.: US 11,641,090 B2
(45) Date of Patent: May 2, 2023

(54) HIGH-PULSE ENERGY, HIGH-POWER LASERS WITH DIFFRACTION-LIMITED PERFORMANCE

(71) Applicant: Raytheon Company, Waltham, MA (US)

(72) Inventors: Aaron B. Potter, Torrance, CA (US); Kalin Spariosu, Thousand Oaks, CA (US)

(73) Assignee: Raytheon Company, Waltham, MA (US)

( * ) Notice: Subject to any disclaimer, the term of this patent is extended or adjusted under 35 U.S.C. 154(b) by 221 days.

(21) Appl. No.: 16/947,109

(22) Filed: Jul. 17, 2020

(65) Prior Publication Data
US 2022/0021175 A1   Jan. 20, 2022

(51) Int. Cl.
*H01S 3/094* (2006.01)
*H01S 3/063* (2006.01)
(Continued)

(52) U.S. Cl.
CPC .......... *H01S 3/09415* (2013.01); *H01S 3/063* (2013.01); *H01S 3/10023* (2013.01); *H01S 3/1618* (2013.01); *H01S 3/2308* (2013.01)

(58) Field of Classification Search
CPC .. H01S 3/09415; H01S 3/063; H01S 3/10023; H01S 3/1618; H01S 3/2308; H01S 3/08; H01S 3/08045; H01S 3/0805; H01S 3/0632; H01S 3/08009; H01S 3/11; H01S 3/1608; H01S 3/1643; H01S 5/02253; H01S 5/4031
See application file for complete search history.

(56) References Cited

U.S. PATENT DOCUMENTS 6,160,824 A  *  12/2000  Meissner .............. H01S 3/0632
                                                                        372/39
7,065,107 B2 *  6/2006  Hamilton ................ H01S 5/141
                                                                        372/98
(Continued)

OTHER PUBLICATIONS

Anderson et al. "Fundamental mode operation of a ribbon fiber laser by way of volume Bragg gratings", Optics Letters, vol. 39, No. 22, Nov. 2014, 3 pages.
(Continued)

*Primary Examiner* — Xinning (Tom) Niu

(57) ABSTRACT

A system includes a planar waveguide that includes an active gain medium configured to receive pump light from a pump source and amplify stimulated emission light. The planar waveguide has a fast axis and a slow axis and is configured to operate in single mode in the fast axis and multimode in the slow axis. The system also includes a hybrid spatial filter configured to receive the amplified stimulated emission light from the planar waveguide and output laser light. The hybrid spatial filter includes a physical slit having a narrower dimension corresponding to the slow axis of the planar waveguide. The physical slit is configured to reduce an intensity of the amplified stimulated emission light received from the planar waveguide. The hybrid spatial filter also includes a Volume Bragg Grating (VBG) configured to constrain an angle of the amplified stimulated emission light and enable compact geometry intra-cavity beam expanding/collimating optics.

20 Claims, 5 Drawing Sheets

(51) Int. Cl.
*H01S 3/0941* (2006.01)
*H01S 3/16* (2006.01)
*H01S 3/10* (2006.01)
*H01S 3/23* (2006.01)

(56) References Cited

U.S. PATENT DOCUMENTS

| | | | |
|---|---|---|---|
| 7,391,796 B1* | 6/2008 | Spariosu | H01S 3/094 372/101 |
| 8,248,700 B1* | 8/2012 | Zorabedian | G02B 27/46 359/618 |
| 2004/0095983 A1* | 5/2004 | Whitley | H01S 5/4062 372/108 |
| 2016/0094016 A1* | 3/2016 | Beach | G02B 27/46 359/558 |
| 2017/0104308 A1 | 4/2017 | Yang et al. | |
| 2018/0212393 A1* | 7/2018 | Filgas | H01S 3/08072 |

OTHER PUBLICATIONS

Choi et al., "Optical transition properties of Yb3+ in new fluorophosphate glasses with high gain coefficient", Journal of Alloys and Compounds, Jan. 2005, 7 pages.

\* cited by examiner

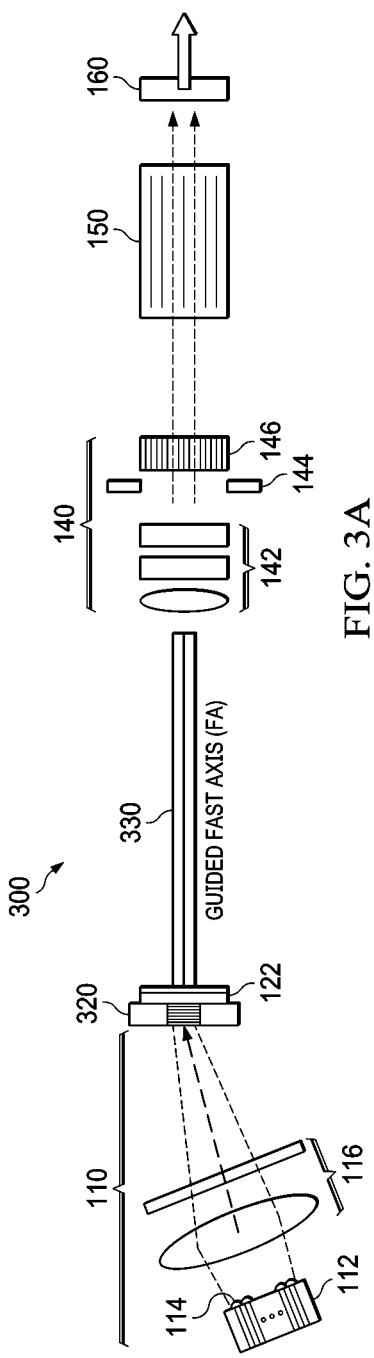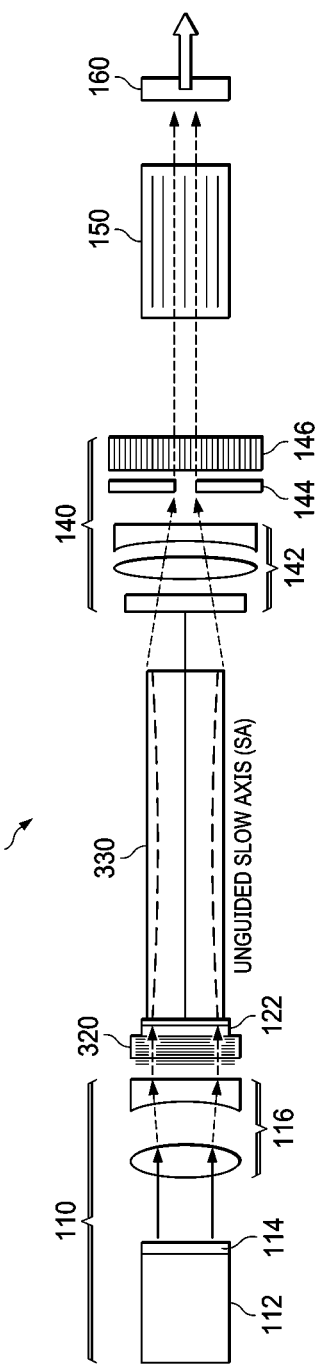

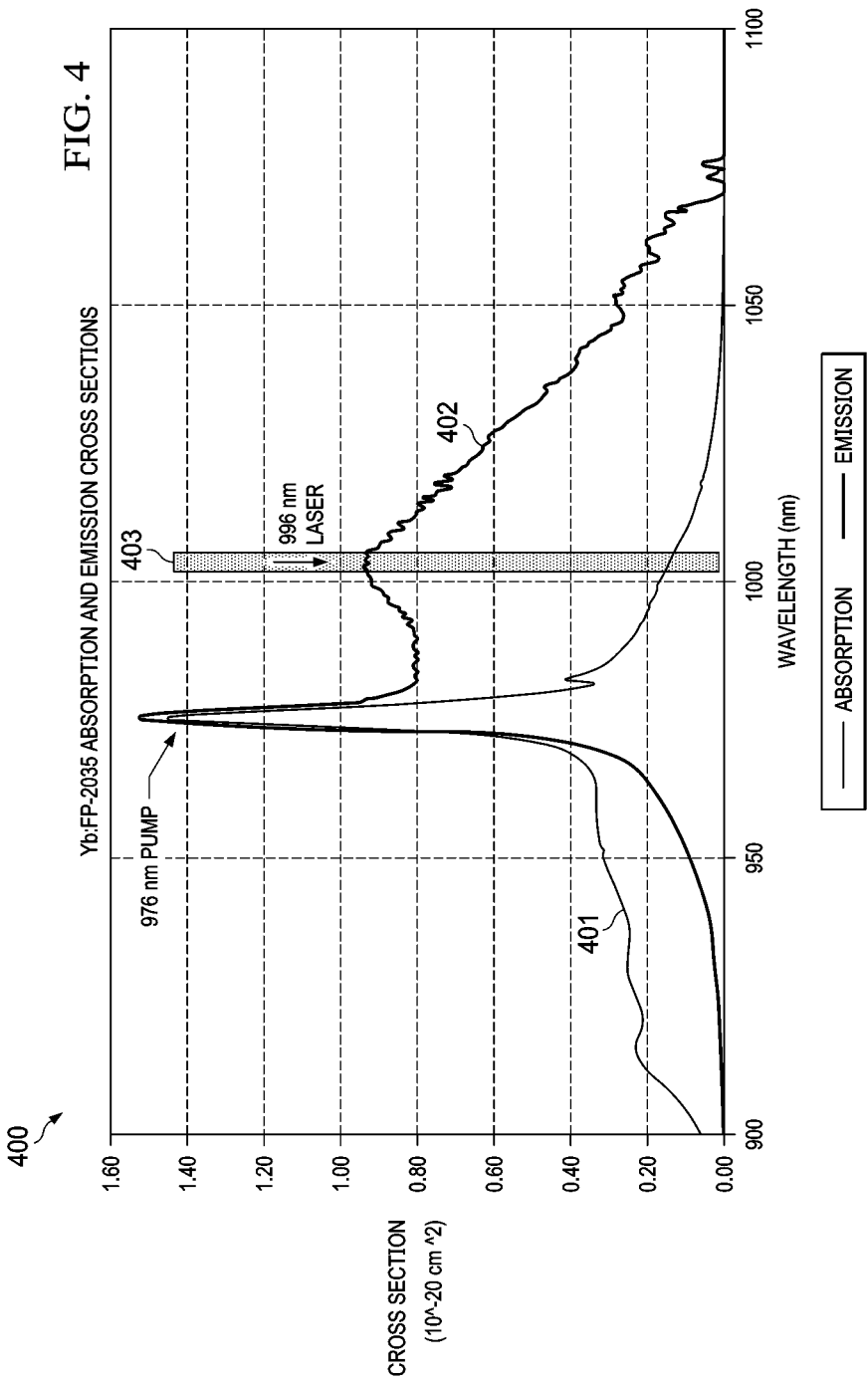

HIGH-PULSE ENERGY, HIGH-POWER LASERS WITH DIFFRACTION-LIMITED PERFORMANCE

TECHNICAL FIELD

This disclosure is directed in general to laser systems. More specifically, this disclosure relates to high-pulse energy, high-power lasers with diffraction-limited performance.

BACKGROUND

Laser systems are often optimized for certain operating conditions at the expense of other desired features. For example, some high-pulse energy lasers may require high overall powers and high efficiencies or operate in wavelengths that are not eye-safe. High-pulse energy (e.g., ~>100 millijoules), high-peak power (e.g., tens of megawatts) lasers operating with high beam qualities and high efficiencies at eye-safe wavelengths currently do not exist. As another example, fiber lasers exist that can operate at eye-safe wavelengths (such as erbium-doped glasses), but these lasers are unable to reach the high pulse energies that bulk solid state lasers can reach. Fiber beam combining can achieve higher average powers but are still restricted to low pulse energies that are fundamental to the limitations of single fiber laser elements.

SUMMARY

This disclosure provides high-pulse energy, high-peak power lasers with diffraction-limited performance.

In a first embodiment, a system includes a planar waveguide that includes an active gain medium configured to receive pump light from a pump source and amplify stimulated emission light. The planar waveguide has a fast axis and a slow axis and is configured to operate in single mode in the fast axis and multimode in the slow axis. The system also includes a hybrid spatial filter configured to receive the amplified stimulated emission light from the planar waveguide and output laser light. The hybrid spatial filter includes a physical slit having a narrower dimension corresponding to the slow axis of the planar waveguide. The physical slit is configured to reduce an intensity of the amplified stimulated emission light received from the planar waveguide. The hybrid spatial filter also includes a Volume Bragg Grating (VBG) configured to constrain an angle of the amplified stimulated emission light.

In a second embodiment, a system includes a pump source configured to generate pump light. The system also includes a planar waveguide that includes an active gain medium configured to receive the pump light from the pump source and amplify stimulated emission light. The planar waveguide has a fast axis and a slow axis and is configured to operate in single mode in the fast axis and multimode in the slow axis. The system further includes a hybrid spatial filter configured to receive the amplified stimulated emission light from the planar waveguide. In some embodiments, the hybrid spatial filter receives high intensity/fluence at a small focus area. The hybrid spatial filter includes a physical slit having a narrower dimension corresponding to the slow axis of the planar waveguide. The physical slit is configured to reduce an intensity of the amplified stimulated emission light received from the planar waveguide. In some embodiments, the physical slit accommodates manageable intensity of the intra-cavity laser pulse from the planar waveguide while still satisfying the spatial mode selection and filtering for diffraction limited beam quality performance. The hybrid spatial filter also includes a VBG configured to constrain an angle of the amplified stimulated emission light. This enables a modest (e.g., much shorter) size/geometry beam expanding telescope while still achieving a robust spatial filtering function. In addition, the system includes a Q-switch configured to receive the reduced-intensity, angle-constrained stimulated emission light from the hybrid spatial filter and convert the reduced-intensity, angle-constrained stimulated emission light to pulsed laser light.

In a third embodiment, a method includes generating pump light using a pump source. The method also includes amplifying stimulated emission light using a planar waveguide that includes an active gain medium, where the planar waveguide has a fast axis and a slow axis and is configured to operate in single mode in the fast axis and multimode in the slow axis. The method further includes receiving the amplified stimulated emission light from the planar waveguide at a physical slit and reducing an intensity of the amplified stimulated emission light, where the physical slit has a narrower dimension corresponding to the slow axis of the planar waveguide, as compared to the dimension corresponding to the fast axis. However, both dimensions of the physical slit are larger than those of conventional spatial filters. The method also includes constraining an angle of the amplified stimulated emission light using a VBG. In addition, the method includes converting the reduced-intensity, angle-constrained stimulated emission light to pulsed laser light using a Q-switch.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which:

FIGS. 3A and 3B illustrate another example diffraction-limited beam quality power oscillator that utilizes robust high-order spatial mode suppression according to this disclosure;

FIG. 4 illustrates an example spectral chart showing possible results that are achievable using the power oscillator of FIGS. 3A and 3B according to this disclosure.

DETAILED DESCRIPTION

Figure 1A:
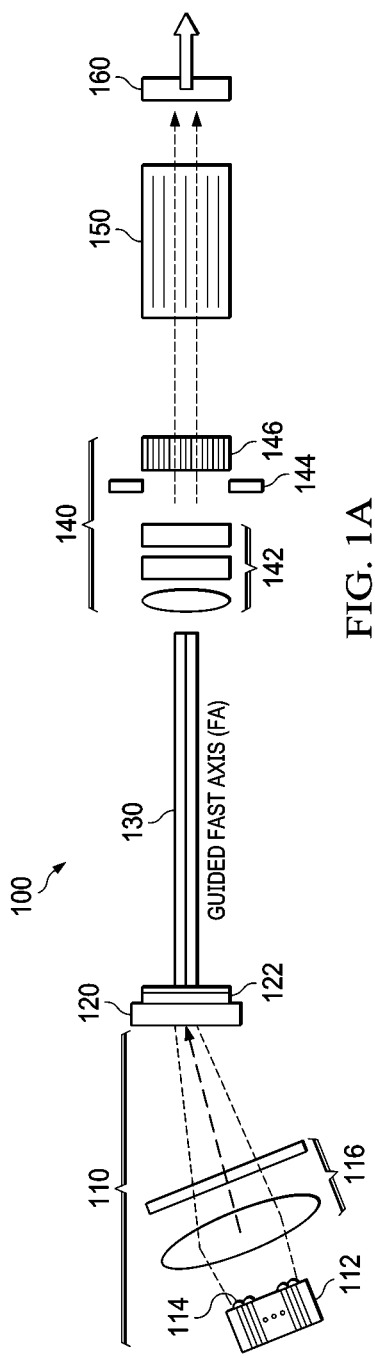
FIGS. 1A and 1B illustrate an example diffraction-limited beam quality power oscillator that utilizes robust high-order spatial mode suppression according to this disclosure.

FIGS. 1A through 5, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

As discussed above, lasers that operate at eye-safe wavelengths, that feature high pulse energies, high peak powers, and average overall powers, and that operate with high beam qualities and high efficiencies currently do not exist. Achieving these laser capabilities have been attempted with various architectures, including fiber laser-based master oscillator-power amplifier (MOPA), optical parametric oscillator (OPO), and optical parametric amplifier (OPA) architectures. MOPA architectures based on erbium (Er) doped gain media can suffer from severe limitations on optical beam qualities and overall system efficiencies, which also limit the desired compact size, weight, and power (SWaP) form factor. MOPA architectures based on Yb: YAG gain media have been attempted but suffer from low efficiencies and modest beam qualities and are not readily scalable to low quantum defect operation near about one micron operation. OPO and OPA approaches can leverage robust one micron laser gain media and associated architectures (such as Nd:YAG and Yb: YAG) but are constrained to parametric conversion limitations to lower pulse energies and average powers and an associated impact on beam quality degradations.

Volume Bragg Gratings (VBGs) have been used for spatial mode control and filtering, but only in continuous wave (CW) laser and low-pulse energy laser architectures. Traditional intra-cavity spatial mode filtering has been implemented previously, but such filters do not provide for extremely high intra-cavity intensity and fluence tolerances needed for the unique waveform described above due to small spatial filter focal apertures. Fiber lasers can operate outside the high energy laser band but are unable to reach the high pulse energies that bulk solid state lasers can reach. Fiber beam combining can achieve higher average powers but are still restricted to low pulse energies that are fundamental to the limitations of single fiber laser elements.

This disclosure provides various embodiments of a diffraction-limited beam quality power oscillator that utilizes robust high-order spatial mode suppression. In some embodiments, the disclosed power oscillator enables a power laser that operates within an eye-safe wavelength range, such as approximately 1500 to approximately 1700 nm. Eye-safe illuminator lasers for high energy laser (HEL) illuminator missions and compact high peak power/pulse energy LADAR transmitters are examples of how these diffraction-limited beam quality power oscillators may be used. Also, in some embodiments, the disclosed power oscillator can be used for tracking lasers in military applications, although any other suitable applications are within the scope of this disclosure.

It will be understood that embodiments of this disclosure may include any one, more than one, or all of the features described here. Also, embodiments of this disclosure may additionally or alternatively include other features not listed here. While the disclosed embodiments may be described with respect to laser systems in specific applications, these embodiments are also applicable in any other suitable systems or applications.

Figure 1B:
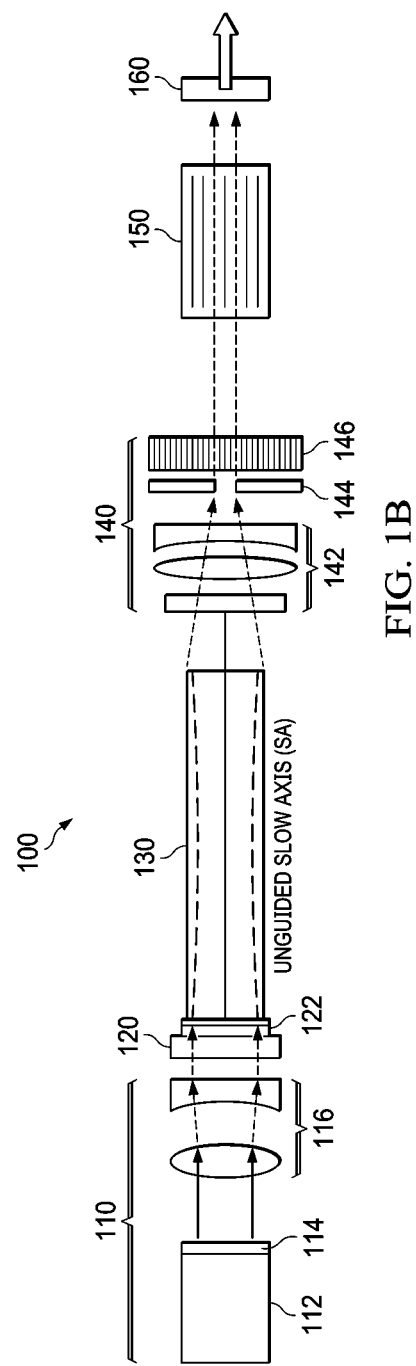

FIGS. 1A and 1B illustrate an example diffraction-limited beam quality power oscillator 100 that utilizes robust high-order spatial mode suppression according to this disclosure. In particular, FIG. 1A shows the power oscillator 100 from a first angle, and FIG. 1B shows the power oscillator 100 from a second angle that is perpendicular to the first angle.

The power oscillator 100 enables a unique high-pulse energy, high-peak power laser that operates within an eye-safe wavelength range, such as approximately 1500 to approximately 1700 nm. This wavelength range is associated with many tracking lasers. In some embodiments, the target lasing wavelength is approximately 1617 nm. Such a laser uses a different gain medium than what is typically used for high-pulse energy lasers. In other embodiments (such as for a beacon illuminator), the target wavelength range can be below one micron (such as approximately 996 nm). The unique design of the power oscillator 100 allows for the generation of an eye-safe wavelength pulsed laser beam with ultra-high-pulse energy and peak power with high average power performance in a compact SWaP footprint and with diffraction-limited beam quality performance. As described below, the power oscillator 100 can achieve ultra-high intra-cavity fluences and intensities with simultaneous near diffraction-limited beam quality in a robust single mode operation.

The power oscillator 100 features a gain-clamped resonator architecture based on a robust cavity mode implementation, which operates inherently at low-order spatial modes for highest brightness and overall efficiency. The resonator architecture leverages high performance coatings, which enables pulse energy and peak power/intensity performance not previously achieved in conventional systems. In some embodiments, the power oscillator 100 operates in a highly-saturated amplifier mode for more efficient energy extraction and for greatly reducing parasitics and nonlinear thermal gradient-related effects, while maintaining a low SWaP footprint at the same time.

As shown in FIGS. 1A and 1B, the power oscillator 100 includes an end pumping system 110, a high reflector (HR) dichroic mirror 120, a planar waveguide 130, a hybrid spatial filter 140, a Q-switch 150, and an output coupler 160. The end pumping system 110 operates as a light pump source and is configured to generate pump light energy that is input into the planar waveguide 130. In this example, the end pumping system 110 includes an array of pump diodes 112, an array of micro-lenses 114, and one or more optical elements 116. The pump diodes 112 generate the pump light energy that is input into the planar waveguide 130. The pump diodes 112 may be stacked together in or on a substrate. The pump diodes 112 represent any suitable source(s) of laser pump light and may generate the pump light at any suitable wavelength(s). For example, in some embodiments, the pump diodes 112 can generate pump light at 1471 nm or 1530 nm, although other wavelengths are possible (such as 976 nm or other wavelengths). Together, the pump diodes 112 generate pump light that is powerful enough for the power oscillator 100 to achieve ultra-high-pulse energy and peak power.

The micro-lenses 114 receive and focus the pump light from the pump diodes 112 and output the focused pump light to the one or more optical elements 116. In some embodiments, the array of pump diodes 112 and the array of micro-lenses 114 have a 1:1 correspondence such that there is one micro-lens 114 for each pump diode 112. The one or more optical elements 116 receive the focused pump light from the micro-lenses 114 and output the pump light to the HR dichroic mirror 120. The optical elements 116 may include one or more anamorphic lenses that focus in the fast axis of the planar waveguide 130 for pump coupling and are beam expanding or collimating in the slow axis of the planar waveguide 130 for pump mode optimization.

The HR dichroic mirror 120 receives the pump light from the end pump system 110 and injects the pump light into the planar waveguide 130, where the pump light is used for amplification of stimulated emission light. The HR dichroic mirror 120 represents any suitable optics for receiving and outputting pump light. In some embodiments, the HR dichroic mirror 120 can be a typical dichroic mirror with slotted pump diode coupling geometry. One or more optical elements 122 can focus the pump light beam from the HR dichroic mirror 120 down to the planar waveguide 130.

The planar waveguide 130 represents a waveguide that has a high aspect ratio, meaning the slow axis dimension is much larger than the fast axis dimension in a cross-section of the planar waveguide 130. In some embodiments, the fast axis dimension is small enough to be commensurate with single mode propagation. This enables robust, single transverse and spatial mode operation in the guided fast axis direction and robust thermal management. In contrast, the slow axis dimension can be significantly larger, such as tens or hundreds of times larger, than the fast axis dimension such that the unguided slow axis is inherently multimode. In some embodiments, the planar waveguide 130 may have an overall cavity length of approximately 200 mm. However, other embodiments could be shorter or longer and are within the scope of this disclosure.

The planar waveguide 130 may include a doped crystal host illuminator, which may operate utilizing a quasi-two laser active gain medium based on the doping material, thus allowing for ultra-low quantum defect operation. In some embodiments, the planar waveguide 130 is formed of an erbium-doped crystalline gain medium, such as erbium-doped yttrium aluminum garnet (Er: YAG) or yttrium silicate (Er: YSO). In other embodiments, the planar waveguide 130 can be formed of other materials, such as ytterbium (Yb) doped fluorophosphate glass. The doping density can be constant throughout the gain medium of the planar waveguide 130, or the gain medium can have a gradient doping density profile for added higher-order divergence mode rejection capability (this can be aided by the inherent nature of the quasi-two level laser dynamics of the doping material). In some embodiments, re-absorption or poor absorption characteristics of the planar waveguide 130 contribute to effective elimination of parasitics, amplified spontaneous emission (ASE), and higher angular mode propagation.

The planar waveguide 130 may utilize mode shaping and high performance optical coatings to provide for ultra-high intra-cavity fluences and intensity capabilities similar to bulk lasers but with much better beam qualities compared to the generally poor quality beams generated by bulk lasers. For example, the doped gain medium of the planar waveguide 130 may be an inherently low gain, stimulated emission cross-section $Er^{3+}$ laser medium, where the $Er^{3+}$ doping of the gain medium results in a rich Stark energy level structure and enables ultra-low quantum defect operation utilizing resonant pumping dynamics.

Amplified stimulated emission light output from the planar waveguide 130 is filtered using the hybrid spatial filter 140. The hybrid spatial filter 140 operates to filter the amplified light from the planar waveguide 130 in the slow axis. More particularly, because the planar waveguide 130 is multimode in the slow axis, the hybrid spatial filter 140 operates to restrict the mode from the laser cavity of the planar waveguide 130. As shown in FIGS. 1A and 1B, the hybrid spatial filter 140 in this example includes one or more optical elements 142, a physical slit 144, and a VBG 146.

The one or more optical elements 142 receive the amplified stimulated emission light from the planar waveguide 130 and focus the amplified light in the slow axis to the narrower dimension of the physical slit 144 while expanding the amplified light beam in the fast axis. The one or more optical elements 142 can include one or more anamorphic lenses, such as one or more fast axis cylindrical collimating lenses. The one or more optical elements 142 can be closely spaced to promote a compact SWaP footprint for the power oscillator 100. For example, in embodiments having a planar waveguide 130 with a 200 mm cavity length, the one or more optical elements 142 can include a collimating lens with a focal length of 35 mm or less, which reduces or minimizes overall resonator length while still allowing for single mode/diffraction-limited divergence matching.

The light from the one or more optical elements 142 passes through the physical slit 144 and then through the VBG 146. The VBG 146 operates to constrain the angle of the amplified light coming out of the planar waveguide 130, which limits the number of angles of the laser path. In some embodiments, the VBG 146 can exhibit angular selectivity of approximately one milliradian, although other values are possible. The result is that the amplified light is more like the output of a fiber-based single mode laser, which results in high beam quality.

The combination of the wide cross-sectional area physical slit 144 and the transmissive VBG 146 ensures single transverse mode restriction in the slow axis direction. The spatial mode selection of the VBG 146 is achieved with a simple one dimensional grating architecture. Without the VBG 146, the amplified light output from the planar waveguide 130 would have to be focused down to a much smaller physical slit 144 to filter out undesired propagating modes. As a result of the VBG 146, the physical slit 144 can be much larger while still achieving single mode operation. The physical slit 144 filters some of the amplified light, thus reducing the overall light intensity of the amplified light. If the VBG 146 were implemented by itself without the physical slit 144, the result could be high light intensity, which can cause air breakdown. Pairing the VBG 146 with the physical slit 144 alleviates this issue. This permits a reduced size of the laser cavity, which improves the overall SWaP of the power oscillator 100.

The reduced-intensity, angle-constrained light that is output from the VBG 146 passes through a Q-switch 150, which converts the light output to pulsed light energy. The Q-switch 150 can represent any suitable structure for generating pulsed light energy from a light source. From the Q-switch 150, the pulsed light can pass through an output coupler 160 and then be output as pulsed laser light.

Figure 2:
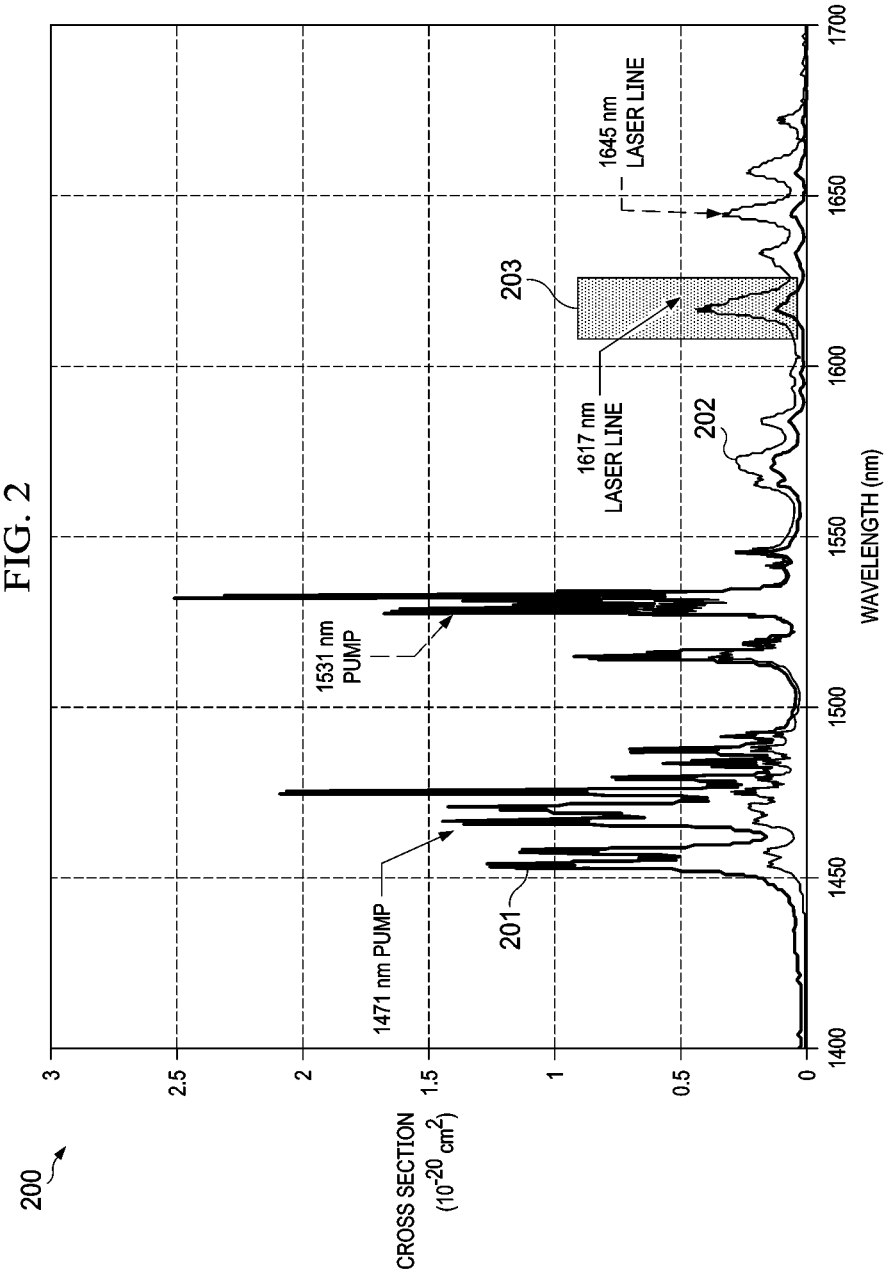
FIG. 2 illustrates an example spectral chart showing possible results that are achievable using the power oscillator of FIGS. 1A and 1B according to this disclosure.

FIG. 2 illustrates an example spectral chart 200 showing possible results that are achievable using the power oscillator 100 of FIGS. 1A and 1B according to this disclosure. As shown in FIG. 2, the chart 200 shows absorption and emission cross-sections at different wavelengths for the power oscillator 100. In particular, a plot 201 shows the Er: YAG absorption cross-sections, and a plot 202 shows the Er: YAG emission cross-sections for wavelengths between 1400 and 1700 nm wavelengths.

As indicated by peaks in the plot 201 at 1471 nm, 1531 nm, 1617 nm, and 1645 nm, the power oscillator 100 results in distinct stimulated emission and laser lines that are well separated in wavelength. This enables the VBG 146 to exhibit a wide tolerance or spectral acceptance window (as indicated by a box 203), thus providing robust spectral laser line selectivity, while still permitting the 1617 nm laser line to pass and effectively rejecting or suppressing competing laser lines (such as 1645 nm). Because the VBG 146 exhibits a wide spectral acceptance, the power oscillator 100 can have a narrow angular acceptance. This means that the pump light is not a concern.

Although FIGS. 1A and 1B illustrate one example of a diffraction-limited beam quality power oscillator 100 that utilizes robust high-order spatial mode suppression, various changes may be made to FIGS. 1A and 1B. For example, while the power oscillator 100 includes a single VBG 146, other embodiments could include multiple VBGs. As another example, the power oscillator 100 could include a different light source in place of the pump diodes 112. In general, the makeup and arrangement of the power oscillator 100 are for illustration only. Components could be added, omitted, combined, or placed in any other configuration according to particular needs. Although FIG. 2 illustrates one example of a spectral chart 200 showing possible results that are achievable using the power oscillator 100 of FIGS. 1A and 1B, various changes may be made to FIG. 2. For instance, the power oscillator 100 may have different absorption and emission cross-sections at different wavelengths.

FIGS. 3A and 3B illustrate another example diffraction-limited beam quality power oscillator 300 that utilizes robust high-order spatial mode suppression according to this disclosure. In particular, FIG. 3A shows the power oscillator 300 from a first angle, and FIG. 3B shows the power oscillator 300 from a second angle that is perpendicular to the first angle.

The power oscillator 300 features a resonator architecture based on a robust cavity mode implementation, which operates with diffraction-limited beam quality for highest brightness and overall efficiency. The power oscillator 300 also provides for robust rejection of parasitics while optimizing extraction efficiency for meeting challenging SWaP metrics required for practical packaging and platform integration of a transmitter laser. The power oscillator 300 also enables challenging illuminator waveform-like performance with suitable average powers, pulse durations, peak powers, and pulse energies at less than one micron operating wavelengths.

As shown in FIGS. 3A and 3B, the power oscillator 300 includes multiple components that are the same as or similar to corresponding components of the power oscillator 100 of FIGS. 1A and 1B. For example, the power oscillator 300 includes an end pumping system 110, a planar waveguide 330, a hybrid spatial filter 140, a Q-switch 150, and an output coupler 160. The hybrid spatial filter 140 includes a VBG 146. The power oscillator 300 also includes some components that are different from the power oscillator 100. For example, instead of an HR dichroic mirror, the power oscillator 300 includes an additional VBG 320. Also, the planar waveguide 330 is formed of different materials than the planar waveguide 130 of FIGS. 1A and 1B.

The end pumping system 110 in this example includes the array of pump diodes 112, the array of micro-lenses 114, and the one or more optical elements 116. In the power oscillator 300, the pump diodes 112 may generate pump light at a wavelength of approximately 976 nm. Using a 976 nm pump light source, the power oscillator 300 can generate output light at approximately 996 nm, which is well-suited for target illumination applications. Of course, other wavelengths are possible and are within the scope of this disclosure.

Pump light from the end pumping system 110 is received at the VBG 320. The VBG 320 includes a reflecting element with a narrow spectral selectivity. The VBG 320 operates to filter the pump light wavelengths that are outside a specified wavelength or specified wavelength range. In some embodiments, the VBG 320 can be tuned for robust rejection of gain lines outside the specified wavelength band. One or more optical elements 122 can focus the pump light from the VBG 320 down to the planar waveguide 330.

The planar waveguide 330 represents a waveguide that has a high aspect ratio, which enables robust, single transverse and spatial mode operation in the guided fast axis direction for robust thermal management and reduced intracavity fluences and intensities in the larger slow axis dimension. The slow axis dimension can be significantly larger, such as tens or hundreds of times larger, than the fast axis dimension such that the unguided slow axis is inherently multimode.

The planar waveguide 330 may include a doped host illuminator, which may operate utilizing a quasi-two laser active gain medium based on the doping material, thus allowing for ultra-low (such as less than 2%) quantum defect operation. In some embodiments, the planar waveguide 330 may be formed of a Yb-doped fluorophosphate glass. Such glass waveguides can lase over a wider range than crystalline waveguides. To account for this, the VBG 320 is disposed before the planar waveguide 330 to provide narrow spectral selectivity, which allows the planar waveguide 330 to lase at approximately 996 nm.

Amplified light output from the planar waveguide 330 is filtered using the hybrid spatial filter 140. The hybrid spatial filter 140 in this example includes the one or more optical elements 142, the physical slit 144, and the VBG 146. The combination of the wide cross-sectional area physical slit 144 and the transmissive, one-dimensional VBG 146 enables high-order spatial mode rejection and ensures single transverse mode restriction in the slow axis direction. The reduced-intensity, angle-constrained light that is output from the VBG 146 passes through the Q-switch 150 and the output coupler 160 similar to the power oscillator 100 of FIGS. 1A and 1B. Together, the VBG 320 and the VBG 146 provide both high rejection ratio spectral selectivity of the target operating wavelength and narrow acceptance angle for forcing a single spatial mode, thus enabling near diffraction beam quality operation. This can be accomplished while utilizing simple one-dimensional grating architectures.

FIG. 4 illustrates an example spectral chart 400 showing possible results that are achievable using the power oscillator 300 of FIGS. 3A and 3B according to this disclosure. As shown in FIG. 4, the chart 400 shows absorption and emission cross-sections at different wavelengths for the power oscillator 300. In particular, a plot 401 shows the Yb-doped fluorophosphate absorption cross-sections, and a plot 402 shows the Yb-doped fluorophosphate emission cross-sections for wavelengths between 900 and 1100 nm.

As indicated by peaks in the plots 401 and 402 at 976 nm, the VBG 320 provides robust spectral laser line selectivity (such as less than 0.1 nm bandwidth) and ensures suppression of competing gain lines. The VBG 146 exhibits a wider spectral acceptance window (such as several nanometers bandwidth) centered at approximately 996 nm as indicated by a box 403.

Although FIGS. 3A and 3B illustrate one example of a diffraction-limited beam quality power oscillator 300 that utilizes robust high-order spatial mode suppression, various changes may be made to FIGS. 3A and 3B. For example, while the power oscillator 300 includes two VBGs 320 and 146, other embodiments could include different numbers of VBGs. As another example, the power oscillator 300 could include a different light source in place of the pump diodes 112. In general, the makeup and arrangement of the power oscillator 300 are for illustration only. Components could be added, omitted, combined, or placed in any other configuration according to particular needs. Although FIG. 4 illustrates one example of a spectral chart 400 showing possible results that are achievable using the power oscillator 300 of FIGS. 3A and 3B, various changes may be made to FIG. 4. For instance, the power oscillator 300 may have different absorption and emission cross-sections at different wavelengths.

Figure 5:
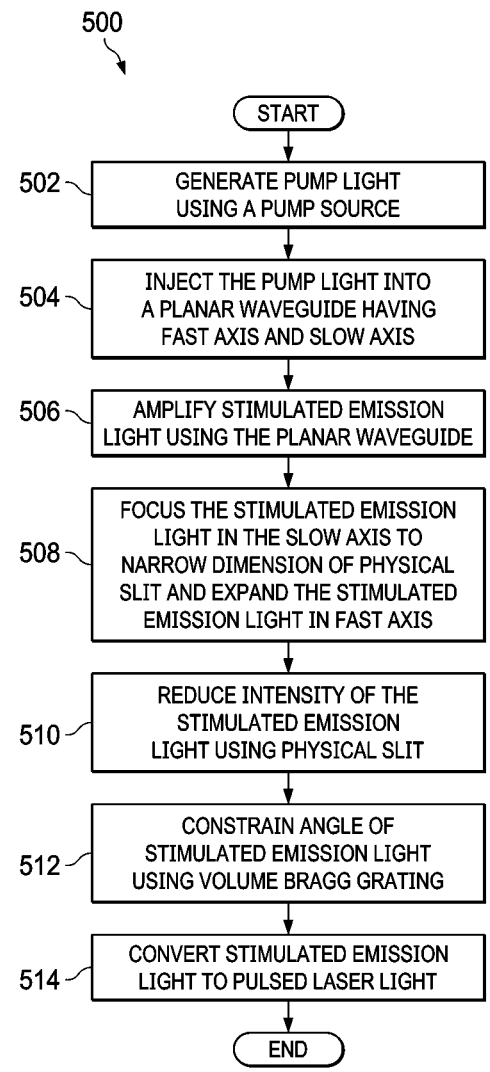
FIG. 5 illustrates an example method for operating a diffraction-limited beam quality power oscillator according to this disclosure.

FIG. 5 illustrates an example method 500 for operating a diffraction-limited beam quality power oscillator according to this disclosure. For ease of explanation, the method 500 is described as being performed using the power oscillator 100 of FIGS. 1A and 1B or the power oscillator 300 of FIGS. 3A and 3B. However, the method 500 could be used with any other suitable device or system.

As shown in FIG. 5, pump light is generated using a pump source at step 502. This may include, for example, the end pumping system 110 (specifically, the array of pump diodes 112) generating pump light. At step 504, the pump light from the pump source is received by at least one component and injected into a planar waveguide. Depending on the embodiment, the at least one component may include, for instance, a high reflector dichroic mirror or a VBG disposed between the pump source and a planar waveguide. The VBG filters wavelengths of the light that are outside a specified wavelength band and can receive the pump light from the end pump system 110 and inject the pump light into the planar waveguide 130. Alternatively, the VBG 320 may receive the pump light from the end pump system 110, filter wavelengths of the light that are outside a specified wavelength band, and inject the pump light into the planar waveguide 330.

At step 506, stimulated emission light is amplified using the planar waveguide, which includes an active gain medium. The planar waveguide 130 includes a fast axis and a slow axis and operates in single mode in the fast axis and multimode in the slow axis. This may include, for example, the planar waveguide 130 amplifying stimulated emission light. At step 508, the amplified stimulated emission light from the planar waveguide is received at one or more optical elements disposed in front of a physical slit. The physical slit has a narrower dimension corresponding to the slow axis of the planar waveguide. The one or more optical elements focus the amplified stimulated emission light in the slow axis to the narrower dimension of the physical slit and expand the amplified stimulated emission light in the fast axis. This may include, for example, the optical elements 142 receiving the amplified stimulated emission light, focusing the amplified stimulated emission light in the slow axis to the narrower dimension of the physical slit 144, and expanding the amplified stimulated emission light in the fast axis.

At step 510, the amplified stimulated emission light from the planar waveguide is received at the physical slit, which reduces an intensity of the amplified stimulated emission light. This may include, for example, the physical slit 144 receiving the amplified stimulated emission light from the one or more optical elements 142 and reducing the intensity of the amplified stimulated emission light. At step 512, a VBG constrains an angle of the amplified stimulated emission light. This may include, for example, the VBG 146 constraining an angle of the amplified stimulated emission light. At step 514, the reduced-intensity, angle-constrained stimulated emission light is converted to pulsed laser light using a Q-switch. This may include, for example, the Q-switch 150 converting the reduced-intensity, angle-constrained stimulated emission light to pulsed laser light.

Although FIG. 5 illustrates one example of a method 500 for operating a diffraction-limited beam quality power oscillator, various changes may be made to FIG. 5. For example, while shown as a series of steps, various steps shown in FIG. 5 could overlap, occur in parallel, occur in a different order, or occur multiple times. Moreover, some steps could be combined or removed and additional steps could be added according to particular needs.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, means to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:
1. A system comprising:
   a planar waveguide comprising an active gain medium configured to receive pump light from a pump source and amplify stimulated emission light, the planar waveguide comprising a fast axis and a slow axis and configured to operate in single mode in the fast axis and multimode in the slow axis;
   a dichroic mirror configured to receive the pump light from the pump source and inject the pump light into the planar waveguide; and a hybrid spatial filter configured to receive the amplified stimulated emission light from the planar waveguide and output laser light, the hybrid spatial filter comprising:
  a physical slit having a narrower dimension corresponding to the slow axis of the planar waveguide, the physical slit configured to reduce an intensity of the amplified stimulated emission light received from the planar waveguide; and
  a Volume Bragg Grating (VBG) configured to constrain an angle of the amplified stimulated emission light.

2. The system of claim 1, wherein the active gain medium of the planar waveguide comprises erbium-doped crystal or ytterbium-doped fluorophosphate glass.

3. A system comprising:
a planar waveguide comprising an active gain medium configured to receive pump light from a pump source and amplify stimulated emission light, the planar waveguide comprising a fast axis and a slow axis and configured to operate in single mode in the fast axis and multimode in the slow axis; and
a hybrid spatial filter configured to receive the amplified stimulated emission light from the planar waveguide and output laser light, the hybrid spatial filter comprising:
  a physical slit having a narrower dimension corresponding to the slow axis of the planar waveguide, the physical slit configured to reduce an intensity of the amplified stimulated emission light received from the planar waveguide;
  one or more optical elements configured to receive the amplified stimulated emission light from the planar waveguide, focus the amplified stimulated emission light in the slow axis to the narrower dimension of the physical slit, and expand the amplified stimulated emission light in the fast axis; and
  a first Volume Bragg Grating (VBG) configured to constrain an angle of the amplified stimulated emission light.

4. The system of claim 3, further comprising:
a second VBG disposed between the pump source and the planar waveguide, the second VBG configured to filter wavelengths of the pump light that are outside a specified wavelength band.

5. The system of claim 1, wherein the output laser light has a wavelength of approximately 996 nm or approximately 1617 nm.

6. The system of claim 1, wherein the output laser light is output from the system via an output coupler disposed in the system.

7. A system comprising:
a pump source configured to generate pump light;
a planar waveguide comprising an active gain medium configured to receive the pump light from the pump source and amplify stimulated emission light, the planar waveguide comprising a fast axis and a slow axis and configured to operate in single mode in the fast axis and multimode in the slow axis;
a dichroic mirror configured to receive the pump light from the pump source and inject the pump light into the planar waveguide;
a hybrid spatial filter configured to receive the amplified stimulated emission light from the planar waveguide, the hybrid spatial filter comprising:
  a physical slit having a narrower dimension corresponding to the slow axis of the planar waveguide, the physical slit configured to reduce an intensity of the amplified stimulated emission light received from the planar waveguide; and
  a Volume Bragg Grating (VBG) configured to constrain an angle of the amplified stimulated emission light; and
a Q-switch configured to receive the reduced-intensity, angle-constrained stimulated emission light from the hybrid spatial filter and convert the reduced-intensity, angle-constrained stimulated emission light to pulsed laser light.

8. The system of claim 7, wherein the active gain medium of the planar waveguide comprises erbium-doped crystal or ytterbium-doped fluorophosphate glass.

9. The system of claim 7, wherein the hybrid spatial filter further comprises one or more optical elements configured to receive the amplified stimulated emission light from the planar waveguide, focus the amplified stimulated emission light in the slow axis to the narrower dimension of the physical slit, and expand the amplified stimulated emission light in the fast axis.

10. The system of claim 7, wherein the pulsed laser light has a wavelength of approximately 996 nm or approximately 1617 nm.

11. The system of claim 7, wherein the pulsed laser light is output from the system via an output coupler disposed in the system.

12. The system of claim 7, wherein the pump source comprises an array of pump diodes.

13. A method comprising:
generating pump light using a pump source;
receiving the pump light from the pump source at a dichroic mirror and injecting the pump light into a planar waveguide comprising an active gain medium;
amplifying stimulated emission light using the planar waveguide, the planar waveguide comprising a fast axis and a slow axis and configured to operate in single mode in the fast axis and multimode in the slow axis;
receiving the amplified stimulated emission light from the planar waveguide at a physical slit and reducing an intensity of the amplified stimulated emission light, the physical slit having a narrower dimension corresponding to the slow axis of the planar waveguide;
constraining an angle of the amplified stimulated emission light using a Volume Bragg Grating (VBG); and
converting the reduced-intensity, angle-constrained stimulated emission light to pulsed laser light using a Q-switch.

14. The method of claim 13, wherein the active gain medium of the planar waveguide comprises erbium-doped crystal or ytterbium-doped fluorophosphate glass.

15. The method of claim 13, further comprising:
receiving the amplified stimulated emission light from the planar waveguide at one or more optical elements disposed in front of the physical slit;
focusing the amplified stimulated emission light in the slow axis to the narrower dimension of the physical slit; and
expanding the amplified stimulated emission light in the fast axis.

16. The system of claim 3, wherein the active gain medium of the planar waveguide comprises erbium-doped crystal or ytterbium-doped fluorophosphate glass.

17. The system of claim 3, wherein the output laser light has a wavelength of approximately 996 nm or approximately 1617 nm.

18. The system of claim 3, wherein the output laser light is output from the system via an output coupler disposed in the system.

19. The method of claim 13, wherein the pulsed laser light has a wavelength of approximately 996 nm or approximately 1617 nm.

20. The method of claim 13, further comprising:
outputting the pulsed laser light via an output coupler.

* * * * *